US008675357B2

(12) United States Patent
Namek et al.

(10) Patent No.: US 8,675,357 B2
(45) Date of Patent: Mar. 18, 2014

(54) DATA CENTER AISLE CONTAINMENT SYSTEM UTILIZING A MOVABLE SASH THAT IS INTEGRAL TO THE COMPUTER RACK CABINET

(76) Inventors: Ramzi Y. Namek, Elkridge, MD (US); Gerard J. Gallagher, Severna Park, MD (US); Thomas Rosato, Shady Side, MD (US)

( * ) Notice: Subject to any disclaimer, the term of this patent is extended or adjusted under 35 U.S.C. 154(b) by 461 days.

(21) Appl. No.: 13/068,280

(22) Filed: May 6, 2011

(65) Prior Publication Data

US 2012/0281352 A1 Nov. 8, 2012

(51) Int. Cl.
*H05K 7/20* (2006.01)
(52) U.S. Cl.
USPC ...... 361/679.51; 361/692; 361/694; 181/202; 181/264; 181/277; 454/184
(58) Field of Classification Search
USPC .............. 361/678, 679.46–679.51, 688–697, 361/701–703, 724–733, 752, 831
See application file for complete search history.

(56) References Cited

U.S. PATENT DOCUMENTS

| | | | |
|---|---|---|---|
| 6,672,955 B2 | 1/2004 | Charron | |
| 7,403,391 B2 | 7/2008 | Germagian et al. | |
| 7,542,287 B2 * | 6/2009 | Lewis et al. | 361/695 |
| 7,656,660 B2 * | 2/2010 | Hoeft et al. | 361/679.51 |
| 7,667,965 B2 * | 2/2010 | Nobile | 361/695 |
| 2004/0099747 A1 * | 5/2004 | Johnson et al. | 236/49.3 |
| 2006/0139877 A1 * | 6/2006 | Germagian et al. | 361/695 |
| 2006/0185931 A1 * | 8/2006 | Kawar | 181/202 |
| 2006/0260338 A1 | 11/2006 | VanGilder et al. | |
| 2007/0135032 A1 * | 6/2007 | Wang | 454/184 |
| 2009/0173017 A1 | 7/2009 | Hall | |
| 2010/0000953 A1 | 1/2010 | Shew et al. | |
| 2010/0061057 A1 | 3/2010 | Dersch et al. | |
| 2010/0108272 A1 | 5/2010 | Karidis | |
| 2010/0190430 A1 | 7/2010 | Rodriguez et al. | |

\* cited by examiner

*Primary Examiner* — Courtney Smith
(74) *Attorney, Agent, or Firm* — William S. Ramsey

(57) ABSTRACT

An embodiment includes a transparent sash mounted integral to the perforated doors on racks which hold computer servers typically installed in data centers. The racks are arrayed in rows forming cold aisles and hot aisles. Cooled air introduced into the cold aisle flows through the racks and cools the servers, and subsequently is removed from the hot aisle. Embodiment sashes slide vertically and extend above the tops of the racks and form a sealing relationship with the data center ceiling and adjacent sashes, thereby preventing wasteful mixing and recirculation of cooled and heated air over the tops of the racks. Embodiments are raised and lowered manually or automatically. The controls for the movement of the sashes are tied to the building automation and fire alarm systems and the sashes are lowered automatically upon activation of the data center fire suppression system, thereby complying with code requirements and avoiding interference with the fire sprinkler and suppression systems.

24 Claims, 8 Drawing Sheets

DATA CENTER AISLE CONTAINMENT SYSTEM UTILIZING A MOVABLE SASH THAT IS INTEGRAL TO THE COMPUTER RACK CABINET

BACKGROUND OF THE INVENTION

1. Field of the Invention

This application relates to the control and management of cooling airflow in computer data centers.

2. Description of Related Art Including Information Disclosed Under 37 CFR 1.97 and 1.98

The cooling of computer servers in data centers, sometimes termed "IT or electronic servers", presents significant problems in efficient energy consumption. The computer servers typically are stacked on shelves in enclosed racks or cabinets some up to seven feet high, three feet wide, and four feet deep. Doors on the front and back sides of the racks retain the servers in the racks and control access to the servers. The front and back doors of the racks are perforated so that cooling air enters through the perforations in the front door, flows over the enclosed computer server, thereby cooling the heat generating processors, and the now heated air exits through the rear door of the rack. Racks are aligned in a data center in arrays of 15 to 20 racks in such a manner that all the front doors of the racks are on the same side of the array. Two parallel arrays of racks with the front doors facing each other constitute a "cold aisle." The rear doors of racks in each array are adjacent to the rear doors of a parallel array with the space between the rear doors of the arrays constituting a "hot aisle." The aisles allow access to the front doors and to the rear doors of the racks for purposes of inspection, maintenance, or replacement, of the computer servers contained within the racks.

Cooled air is introduced into a cold aisle, typically through perforated floor tiles in a raised access floor or through overhead ductwork. The cooled air within the cold aisle is drawn into the perforations in the front doors by fans in the computer servers; the air cools the computers; and the now heated air is extruded through the perforated back door into the hot aisle. Such heated air is then cooled by air conditioning apparatus and returned to the cold aisle or simply extruded from the data center.

The above cold aisle-hot aisle system suffers significant inefficiencies which stem from the mixing and recirculation of air between the cold aisle and the hot aisle over the top of the racks. The energy expended in the cooling of air which mixes above the racks is wasted, as that cooled air never is used to cool the computer servers.

A variety of containment approaches have been proposed to reduce or remove this inefficiency. The containment situation is complicated by the requirement that the space above the racks be free of obstructions for the proper flow of water from automatic sprinklers activated in case of a fire event. The following prior art represent approaches to solving this problem.

U.S. Pat. No. 6,672,955 discloses an Internet Data Center with a plenum below the floor for fresh air which opens to a cold aisle tunnel. Heated air freely flows upward from the hot aisle and is collected at a plenum at the top of the Center.

U.S. Pat. No. 7,403,391 discloses a data center with a number of embodiments, all of which involve a cooling unit positioned adjacent to a rack. In some embodiments flat or curved panels are located at the top of the racks, which restrict but don't prevent airflow between aisles.

U.S. Pat. No. 7,542,287 discloses racks which are fully enclosed except for the front side which admits cooled air and with ducts at the top for removal of heated air.

U.S. Pat. No. 7,667,965 discloses acoustically absorptive vertical anti-recirculation panels fixed by L shaped brackets to tops of adjacent racks.

U.S. Pub. Pat. Applic. No. 2006/0260338 discloses a system of baffles, doors, and slanted baffles attached to the top of racks to impede the horizontal flow of warm air from a hot aisle to a cold aisle.

U.S. Pub. Pat. Applic. No. 2009/0173017 discloses partitions on the tops of racks which are normally in the vertical position to inhibit unwanted airflows. The partitions are hinged at the attachment to the rack and are supported by guy-wires with fusible trigger-point assemblies which releases the partitions at a predetermined temperature, allegedly restoring the unrestricted gap between rack top and ceiling required by the fire-code.

U.S. Pub. Pat. Applic. No. 2010/0000953 discloses modular blocking panels which close off unused sections of a rack.

U.S. Pub. Pat. Applic. No. 2010/0061057 discloses modular panels which extend from adjacent racks to form a ceiling over a hot or cold aisle.

U.S. Pub. Pat. Applic. No. 2010/0108272 discloses a curtain-like roll-up air barrier with a spring-loaded roller fastened to the ceiling and with the bottom fastened to a hold down structure located on top of an IT rack. Water soluble loops fasten the barrier to the hold down structure and are designed to release the barrier when wetted by a sprinkler system.

U.S. Pub. Pat. Applic. No. 2010/0190430 discloses a computer room air conditioning system with a physical separation on the top of racks separating the hot and cold aisles.

None of the discovered prior art solves the problems solved by embodiments of the present disclosure. In particular, embodiments solve the problems of preventing mixing of cooled and heated air above the racks while meeting the fire suppression requirements, and have the further advantages of allowing installation, inspection, replacement, or maintenance of individual racks and servers contained within the racks without interruption to working data centers. In addition, embodiments can be installed without the requirement of interruption to working racks and the IT servers within the racks.

The foregoing examples of the related art and limitations related therewith are intended to be illustrative and not exclusive. Other limitations of the related art will become apparent to those of skill in the art upon a reading of the specification and a study of the drawings.

BRIEF SUMMARY OF THE INVENTION

A system for controlling the flow of air over the top of racks containing computer servers arrayed in rows in a room was disclosed. The system comprised: A computer rack door with openings which allow air flow through the door. Channels are attached to the sides of the door, arrayed parallel to the sides of the door, with the tops of the channels near the top of the door. A rectangular air impermeable sash was capable of mounting on the door through interaction of the side edges of the sash with the channels. The sash was vertically movable from a lower position wherein the top edge of the sash is approximately adjacent to the top edge of the door, and the upper position in which the top edge of the sash is capable of touching the ceiling of the room. There are seals on both the top edge and the two side edges of the sash. When in the upper position the seal on the top edge is capable of a sealing interaction with the ceiling, and when in the upper position the seals on the side edges of the sash are capable of a sealing interaction with seals on adjacent sashes which are also in the upper position. An elevation mechanism is capable of elevating and lowering the sash between the lower and upper positions. The elevation mechanism is capable of operation in response to signals from a control mechanism. There is a control mechanism capable of signaling the elevation mechanism. Embodiments can be mounted on either the front door or rear door of a rack.

The following embodiments and aspects thereof are described and illustrated in conjunction with systems, tool and methods which are meant to be exemplary and illustrative, not limiting in scope. In various embodiments, one or more of the above-described problems have been reduced or eliminated, while other embodiments are directed to other improvements.

In addition to the exemplary aspects and embodiments described above, further aspects and embodiments will become apparent by reference to the drawings and by study of the following descriptions.

BRIEF DESCRIPTION OF THE SEVERAL VIEWS OF THE DRAWING(S)

DETAILED DESCRIPTION OF THE INVENTION

Figure 1:
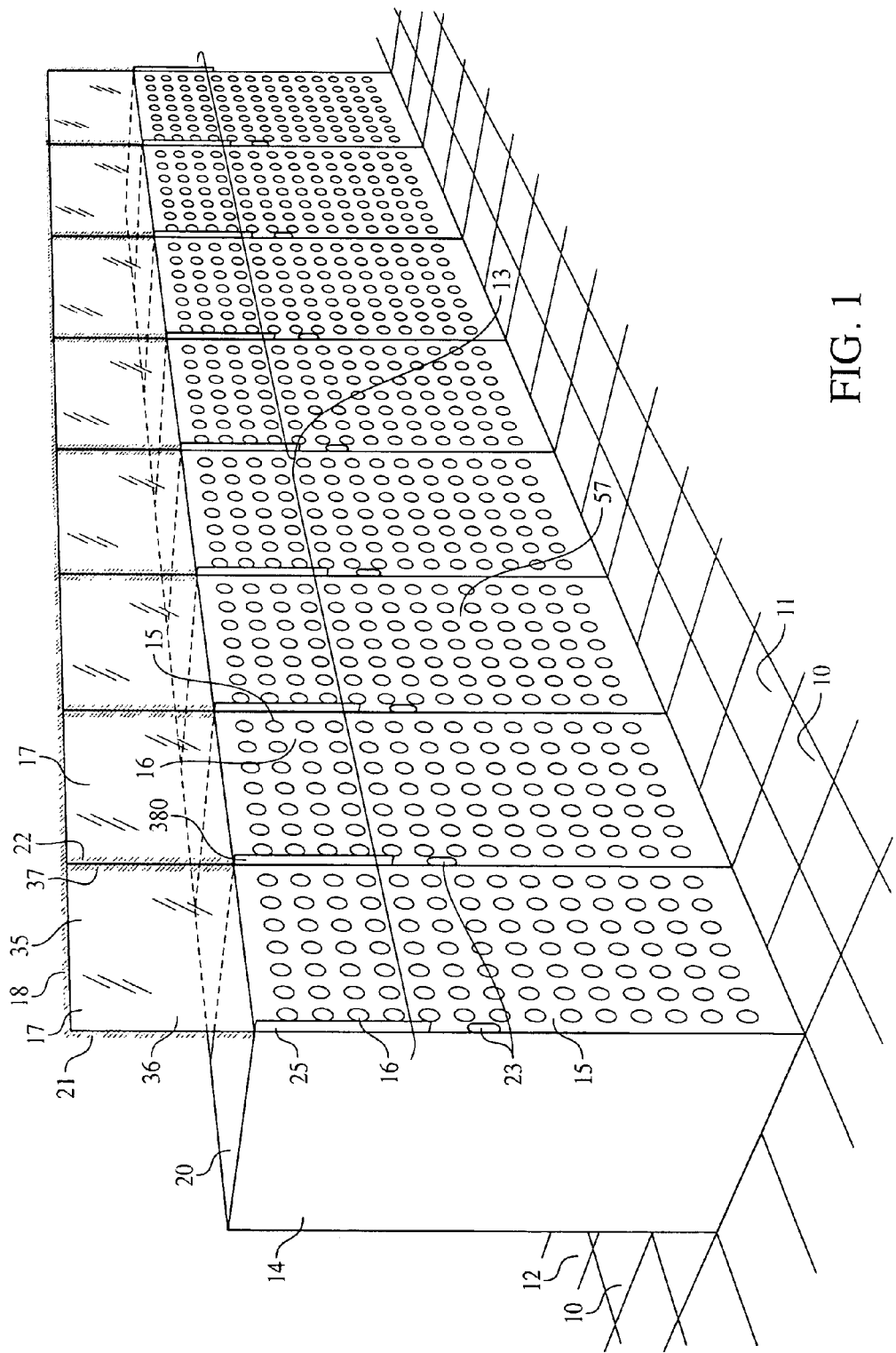
FIG. 1 is a perspective view of the interior of a data center showing an array of server racks each with a first embodiment sash system mounted on the front door.

FIG. 1 is a perspective view of the interior of a data center showing an array of server racks each with a first embodiment sash system. The sash system is comprised of a sash, sash mounts, elevation mechanism, and control system. The first embodiment sash system is connected to the rack front door. Visible in FIG. 1 is the data center floor 10, the cold aisle 11 through which cooled air is delivered, and the hot aisle 12 into which air which has been used to cool the computer servers is collected. An array 13 of racks is shown comprised of a multiplicity of similar individual racks 14. Also visible is the individual rack front door 15 which has a multiplicity of ventilation holes 16, and a rack handle 23 for opening the rack front door 15. A transparent sash 17 is shown in the upper position in which it extends above the rack top 20. The top gasket 18 at the top edge 35 interacts with and has a sealing relationship with the data center ceiling (not shown in FIG. 1).

A left gasket 21 is located at the left side of the sash 17 and a right gasket 22 is located at the right side of the sash 17. Interaction between the right gasket 22 of sash 17 on rack 14 and the left gasket 38 of sash 37 of adjacent rack 57 seals the sashes 17 and 37 between adjacent racks. Similar gasket interactions between sashes in the array seal the area above the racks in the array and below the ceiling.

Figure 2:
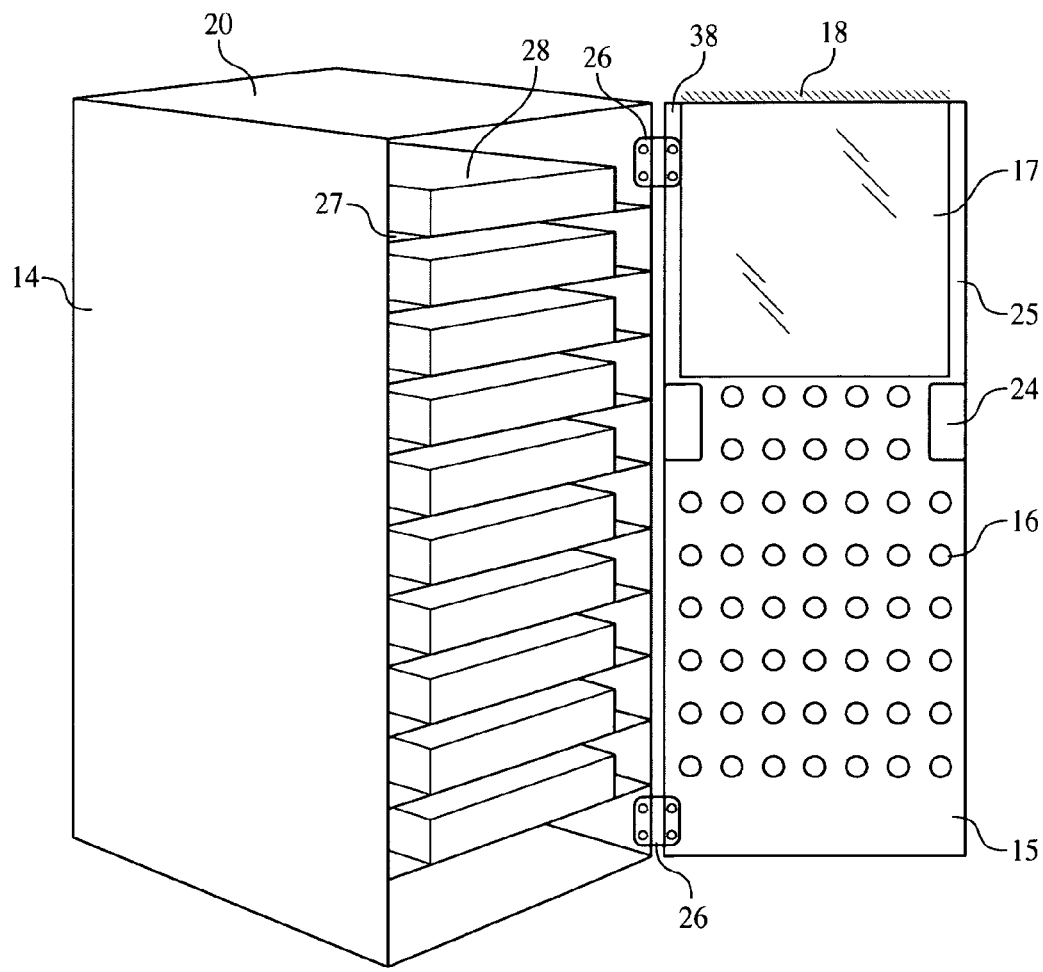
FIG. 2 is a perspective view of a rack with a first embodiment sash system with the rack front door open and the sash in the lower position.

FIG. 2 is a perspective view of a rack 14 with a first embodiment sash 17 with the rack door or front side 15 open and the sash in the lower position. Visible in FIG. 2 are ventilation holes 16 in the rack door or front side 15, and hinges 26 which attach the rack front door to the rack. A number of shelves 27 vertically arranged within the rack are visible, with servers 28 sitting on the shelves. In FIG. 2 the sash 17 is in the lowered position. The sash 17 is mounted and retained between two U-shaped channels 25 attached to the inside of the front door 15. Also visible in FIG. 2 are the elevation mechanisms 24 which raise and lower the sash. When the sash 17 is in the lowered position the top gasket 18 is approximately level with the top of the door and the top 20 of the rack 14.

Figure 3:
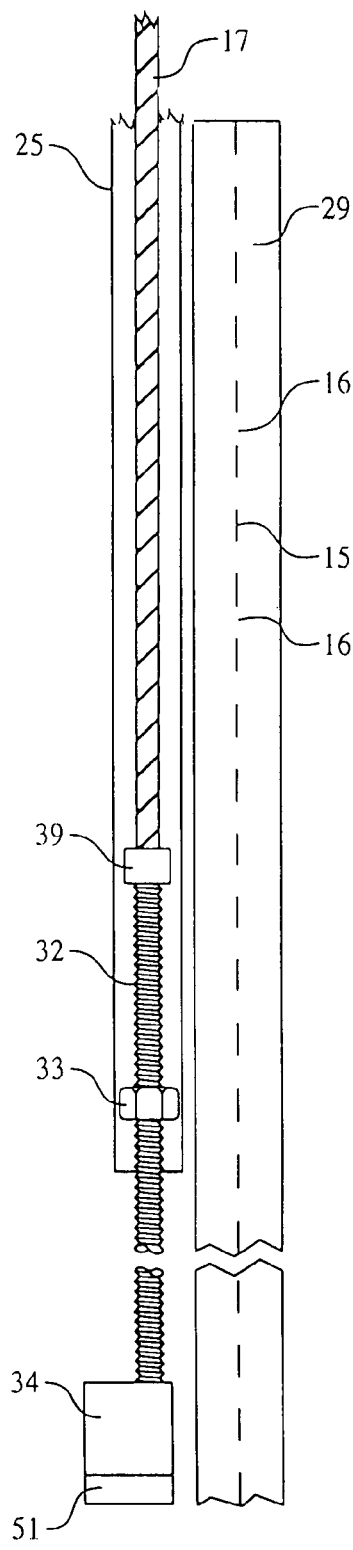
FIG. 3 is a cross-sectional view of the upper region of a rack door showing a first embodiment elevation device.

FIG. 3 is a vertical cross-sectional view of the upper region of a rack door showing a first embodiment elevation mechanism in a partially elevated position. Visible in FIG. 3 is the door frame 29, the door 15 with ventilation holes 16 and U-shaped channel 25. The sash 17 is shown retained within the U-shaped channel 25. In the first embodiment elevation mechanism an elongated screw 32 is connected to the bottom edge of the sash 17 via a bushing 39. A nut 33 is firmly attached to the inside of the U-shaped channel 25. The screw 32 is rotated by the screw rotator 34 to raise or lower the sash. Similar elevation devices are located on each side of the sash. Also visible in FIG. 3 is an optional battery 51. The battery provides power to the screw rotator 34 and automatically lowers the sash to lowest position in the event of failure of both the main power source and back-up power source to the data center.

Figure 4:
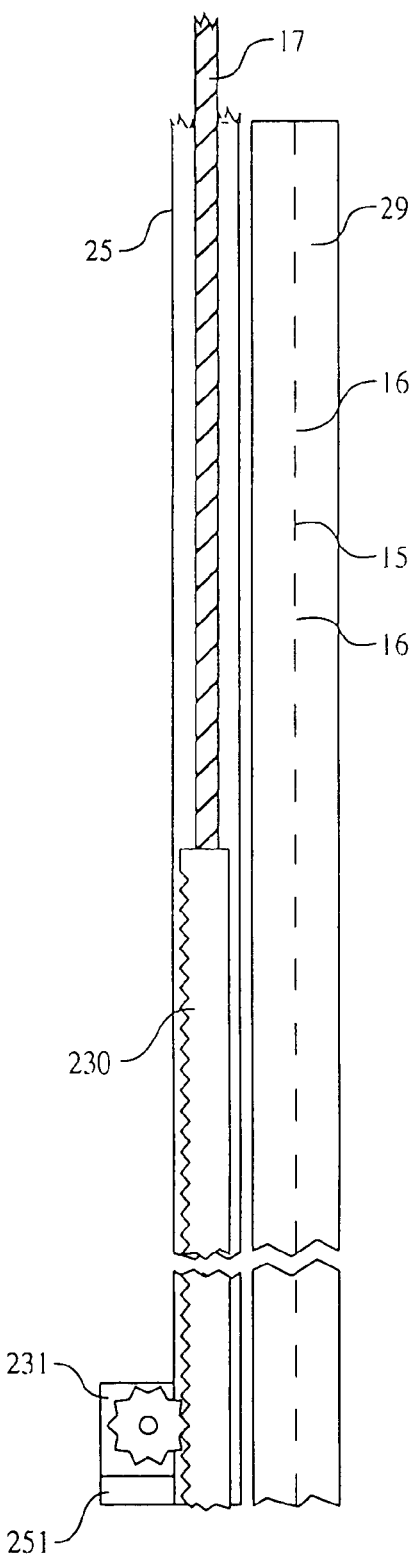
FIG. 4 is a cross-sectional view of the upper region of a rack door showing a second embodiment elevation device.

FIG. 4 is a vertical cross-sectional view of the upper region of a rack door showing a second embodiment elevation mechanism in a partially elevated position. Visible in FIG. 4 is the door frame 29, the door 15 with ventilation holes 16 and U-shaped channel 25. The sash 17 is shown retained within the U-shaped channel 25. In the second embodiment a notched rod 230 is connected to the bottom edge of the sash 17. The rod 30 is raised or lowered by a geared rotator 231 to raise or lower the sash. Similar elevation devices are located on each side of the sash. Also visible in FIG. 4 is an optional battery 251. The battery provides power to the gear rotator 231 and automatically lowers the sash to lowest position in the event of failure of both the main power source and back-up power source to the data center.

Figure 5:
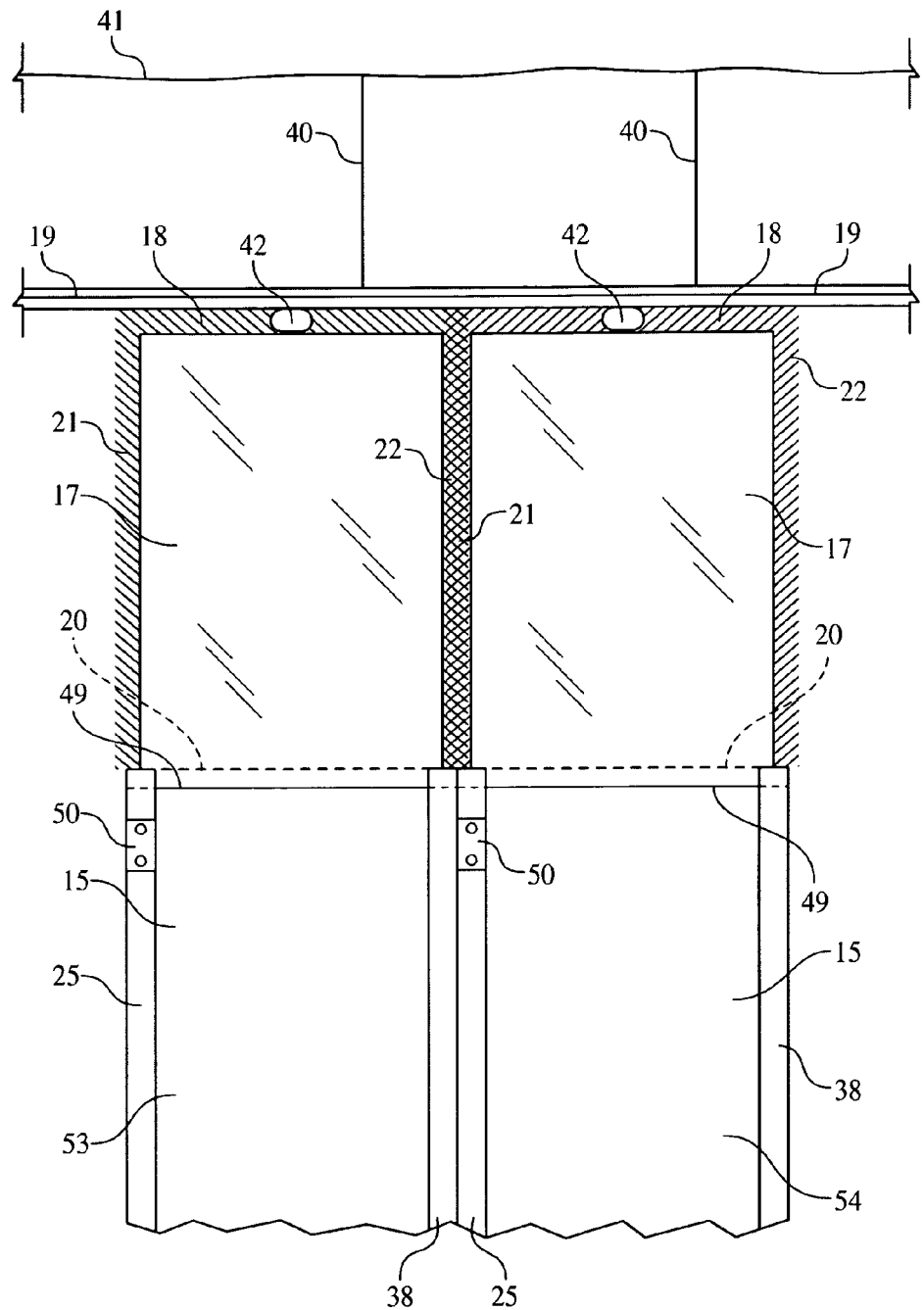
FIG. 5 is a front view of an elevated sash showing the relationship between adjacent sashes, a data center suspended ceiling, and a data center sprinkler system.

FIG. 5 is a front view of an elevated sash showing the relationship between adjacent sashes, a data center suspended ceiling, and a data center sprinkler system. Visible in FIG. 5 are the data center roof structure 41, suspender wires 40 which connect the roof structure 41 with the data center ceiling 19 and support the ceiling 19. FIG. 5 shows the interactions between the left rack 53 and right rack 54 and the ceiling 19. Visible in FIG. 5 are the left U-shaped channel 25 and right U-shaped channel 38 of the left 53 and right 54 racks. In FIG. 5 the sashes 17 are in the raised or upper position in close proximity to the ceiling with the top sash gaskets 18 forming a sealing relationship with the ceiling 19, such sealing relationship preventing or inhibiting the passage of air over the tops of the sashes. In addition, the sashes in the upper position prevent the passage of air over the tops 20 of the left 53 and right 54 racks. The sash bottom edges 49 do not extend above the tops 20 of the racks. Sprinkler heads 42 mounted on the ceiling 19 also are shown. A sealing relationship is formed between the right gasket 22 of the left rack 53 sash and the left gasket 21 of the right rack 54 sash. The control boxes 50 mounted on the U-shaped channels 25 of left 53 and right 54 racks are also shown in FIG. 5.

Figure 6:
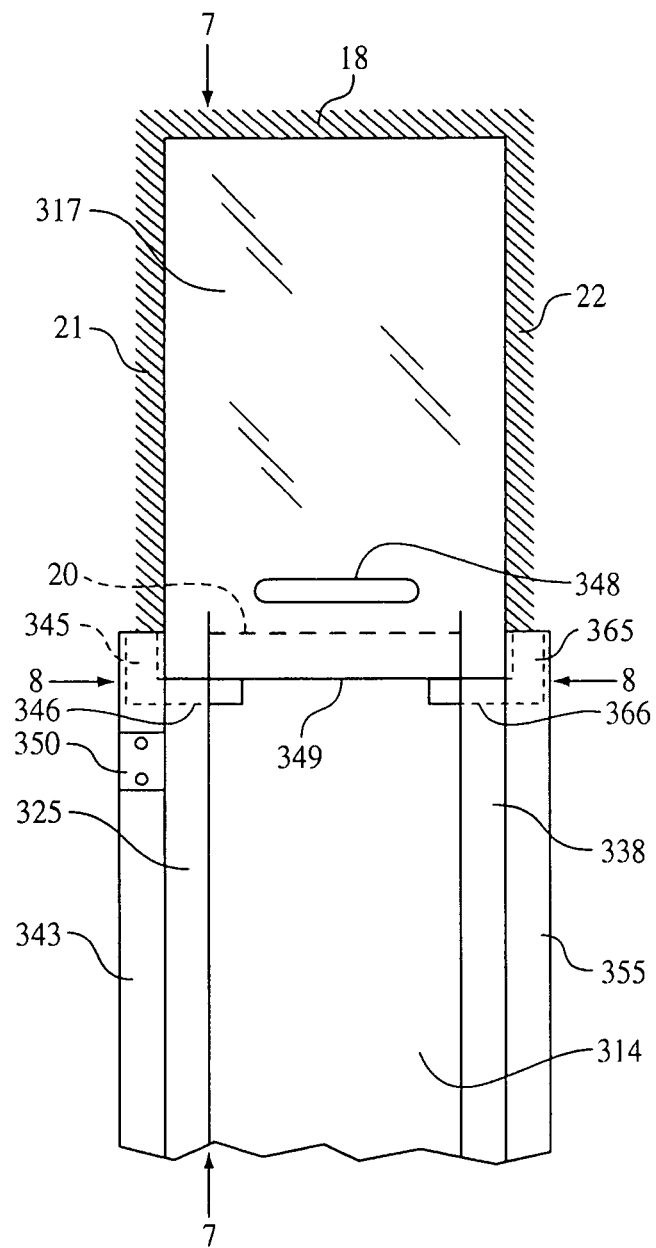
FIG. 6 is a front view of an elevated sash showing a manual embodiment sash.

FIG. 6 is a front view of an elevated sash showing a manual embodiment sash. This manual embodiment sash 317 is moved between the upper and lower positions by an operator using the handle 348. Upper seal 18, left seal 21 and right seal 22 are shown on the edges of the sash 317. The sash 317 is mounted between the left U-shaped channel 325 and right U-shaped channel 338. Connected to the left channel 325 is a left square conduit 343 and connected to the right channel 338 is a right square conduit 355. A slot (not visible in FIG. 6) is located in the side of the square conduit which is attached to the back of the U-shaped channel and extends through both the square conduit and U-shaped channel and extends through the length of the conduits and U-shaped channels. Additional detail on the conduits, channels, and slots are found in FIG. 8. A left piston 345 is capable of vertical movement within the left square conduit 343. A left piston arm 346 is attached at an approximately right angle to the piston, and the arm extends through the slot in the conduit and the U-shaped channel and is attached to and supports the bottom edge 349 of the sash 317. Similarly, a right piston 365 and right piston arm 366 also support and are connected to the bottom edge 349 of the sash 317. A control box 350 for controlling the locking mechanism is shown in FIG. 6. One embodiment mechanism for retaining the sash in a raised position is shown in FIG. 7.

Figure 7:
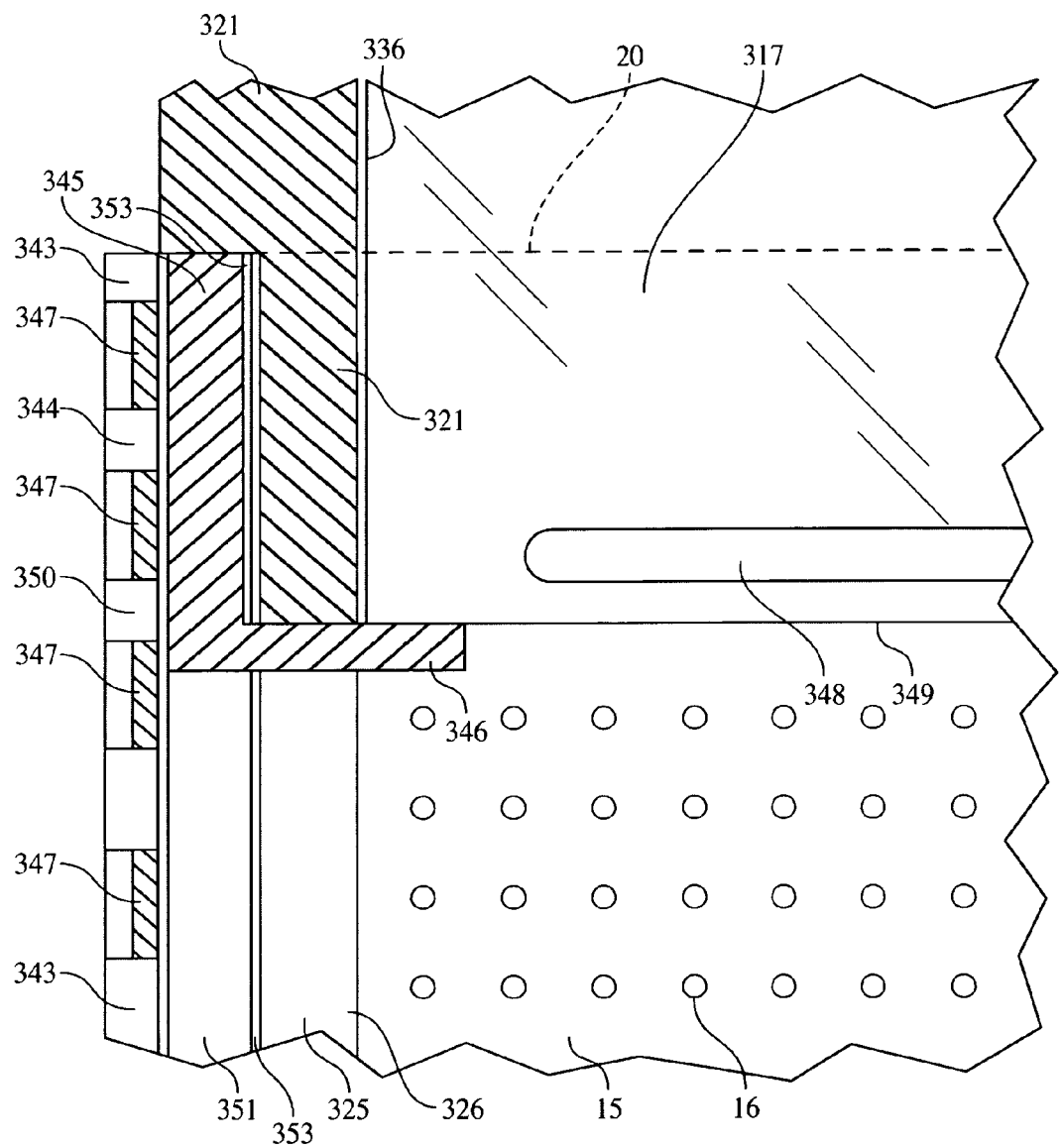
FIG. 7 is a cross-sectional view taken at 7-7 of FIG. 6 showing a manual embodiment sash elevation and locking mechanism.

FIG. 7 is a vertical cross-sectional view taken at 7-7 of FIG. 6 showing a manual embodiment sash elevation and locking mechanism. In this embodiment the sash is retained in a raised position by electromagnets. Visible in FIG. 7 is the sash 317 and handle 348 which is used for manually raising and lowering the sash. Also visible is the left seal 321 attached to the sash left edge 336. In this embodiment the seal is comprised of grommet filaments which are compressed by the U-shaped channel 325 when in the lowered position and extend fully to interact with an adjacent grommet when extended above the top 20 of the rack. Also visible in FIG. 7 is the back side 326 of the left U-shaped channel 325. The left U-shaped channel 325 is attached to the left square conduit 343, of which the back edge 350, left edge 351, and front edge 353 of the square conduit are visible in FIG. 7. A multiplicity of electromagnets 347 are arrayed along the back edge 350 of the square conduit. Also visible is the piston 345 with an arm 346 which extends from the piston and is connected to and supports the bottom edge 349 of the sash 317. The piston 345 may be moved vertically within the square conduit 343 and retained at any level by activation of the electromagnets which are arrayed along the back edge 350 of the square conduit. De-activation of the electromagnets allows the piston and attached sash to move to a lower position by the action of gravity. Also visible in FIG. 7 is the rack door 15 and ventilation holes 16 in the door.

Figure 8:
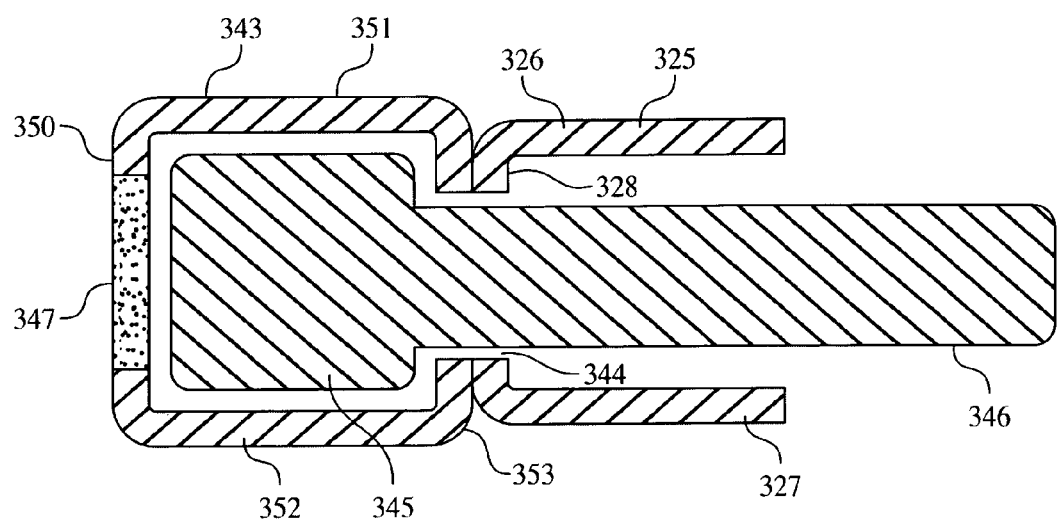
FIG. 8 is a cross-sectional view taken at 8-8 of FIG. 6 showing a manual embodiment sash locking mechanism.

FIG. 8 is a cross-sectional view taken at 8-8 of FIG. 6 showing a manual embodiment sash locking mechanism. Visible in FIG. 8 is the left square conduit 343 comprised of a left edge 351, back edge 350, right edge 352 and front edge 353 of the square conduit. A slot 344 extends through the length of the front edge 353 of the square conduit. Attached along the length of the left square conduit 343 is the left U-shaped channel 325. The left U-shaped channel 325 is comprised of a back edge 328, left edge 326, and right edge 327. The back edge 328 of the left U-shaped channel 325 is attached along its length to the front edge 353 of the left square conduit 343. The slot 344 which extends through the front edge 353 of the left square conduit 343 also extends through the back edge 328 of the left U-shaped channel 325. Also visible in FIG. 8 is the piston 345 with attached arm 346. An electromagnet 347 is visible on the back edge 350 of the left square conduit 343.

Figure 9:
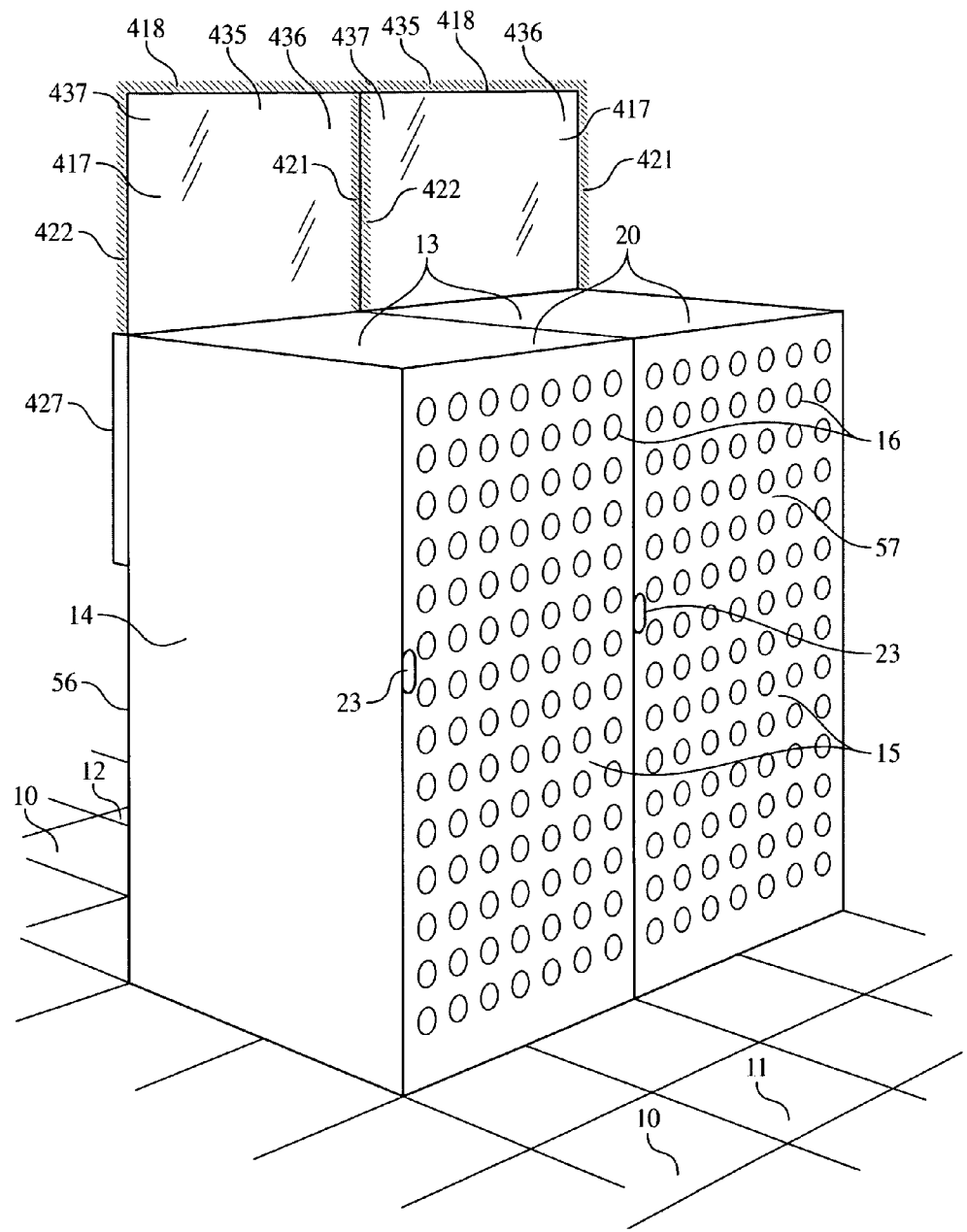
FIG. 9 is a front view of an array of racks showing the embodiment in which the sash is attached to the back door of the rack.

FIG. 9 is a front view of an array of racks showing the second embodiment sash system in which the sash 417 is attached to the back door 56 of the rack 14. Other elements of the second embodiment sash system, such as the sash mounts, the elevation mechanism, and the control mechanism, are the same as in the first embodiment in which the sash is attached to the rack front door. Visible in FIG. 9 is the data center floor 10, the cold aisle 11 through which cooled air is delivered, and the hot aisle 12 into which air which has been used to cool the computer servers is collected. An array 13 of racks is shown comprised of a multiplicity of similar individual racks 14. Also visible is the individual rack front door 15 which has a multiplicity of ventilation holes 16, and rack handle 23 for opening the rack door 15. A transparent sash 417 is shown in the upper position in which it extends above the rack top 20. The top gasket 418 at the top edge 435 interacts with and has a sealing relationship with the data center ceiling (not shown in FIG. 9). A left gasket 421 is located at the left side 436 of the sash 417 and a right gasket 422 is located at the right side 437 of the sash 417. Interaction between the right gasket 422 of sash 417 on rack 57 and the left gasket 421 of sash 417 of adjacent rack 14 seals the sashes 417 between adjacent racks. The top edge gasket 418 is located at the top edge 435 of the sash 417. The top edge gasket 418 seals the top edge 435 of the sash 417 against the ceiling (not shown in FIG. 9). The right side U-shaped channel 427 is visible at the rear side 56 of the rack 14.

The second or back door or rear door embodiment sash system performs the same function as the first embodiment sash system, that of preventing or inhibiting the flow of air over the top of the racks in the array. By preventing the flow of air over the arrays, the efficiency of cooling in the data center is increased. The rear door embodiment has the advantage of being capable of installation without effecting the access into the rack for purposes of inspection, maintenance, replacement or installation of the computer servers in the rack.

In embodiments sashes have seals attached to the two side edges and the top edge to create an air lock with the adjacent sash door or doors in the array and with the ceiling. These seals prevent circulation of hot air from the hot aisle back into the cold aisle, which results in wasted energy. The use of flexible seals at the top of the sash, and the ability to raise the sash just enough to contact the ceiling, allows the efficient sealing of the sashes despite irregularities and variations in the height of the ceiling.

Embodiment seals are any suitable flexible, resilient materials capable of sealing interaction between the top of a sash and the ceiling, as well as with seals on a sash on an adjacent rack. Embodiment seals are manufactured of strips or fibers of plastics and rubber. Embodiment seals are grommet brushes.

Grommet seals are comprised of fibers or filaments arranged in an extended array and retained at one end of the filaments by a filament holder. Such grommet seals are often used to seal against air penetration areas in data centers where electrical cables penetrate the floor or there are other unsealed floor openings. Embodiments include filaments of diameter of 0.010 inch to 0.036 inch. Such fibers typically have a length of 3 inch to 6 inches. Suitable materials for fibers include nylon Type 6. Suitable grommet seals include Item No. 10012

Extended Raised Floor Grommets available from Upsite Technologies, Albuquerque, N. Mex.

The control mechanism can be activated in two ways. Control buttons on the rack door control the movement of the sash to the upper position or the lower position or any position in between. For example, the control buttons are used to lower the sash when it is desirable to open the door for inspection, maintenance, or replacement of the computer servers contained within the rack. After the servicing is complete, the control buttons are used to raise the sash to a sealing relationship with the ceiling and adjacent elevated sashes.

The second method of activating the control mechanism is automatic and is controlled by the fire detection and response system. A data center generally has a smoke detection and a sprinkler system located on the ceiling. In the event of a fire the smoke detection and sprinkler systems are activated and a fire alarm is sounded. Embodiments of the present application also respond to the event of a fire with automatic activation of the control mechanism with movement of the sash to the lower position. The sash also is automatically lowered using an optional battery when both the conventional or mains source of electricity is interrupted and the back-up source of electrical power is also interrupted. In manual embodiments the sash is automatically lowered by gravity through the release of electromagnets when the fire detection and sprinkler system is activated or when both the conventional or mains source of electricity is interrupted and the back-up source of electrical power is also interrupted. This insures that the spray of water or other fire-extinguishing fluid from the sprinkler system would not be blocked by the sash but will be capable of uninhibited penetration into the arrays of racks and aisles with extinguishment or containment of the fire.

In embodiments the sash is transparent or translucent in order to maximize the efficiency of a lighting system mounted in or on the ceiling of the data center. Embodiment sashes are manufactured by any suitable strong, hard, transparent or translucent material such as poly (methyl methacrylate), polycarbonate, polystyrene, polyvinyl chloride, polyethylene terephthalate, polyethylene, polypropylene, or other suitable plastic. Embodiments also are manufactured of glass, such as soda lime glass or borosilicate glass.

Embodiment sashes also can be manufactured of opaque materials for use in data centers where lighting efficiency is not a factor. Embodiment materials for such sashes include steel, aluminum, iron, and copper.

Embodiments, when installed with sashes in the elevated or upper position, accomplish a containment of the cold aisle and inhibit the movement and recirculation of cooled air or heated air over the tops of the racks, thereby increasing the efficiency of server cooling. Use of embodiments insures maximum efficiency in use of cooled air in maintaining the servers at optimum temperature.

Embodiments are suitable for retrofitting into existing racks. Furthermore, retrofitting can be done without interruption of the operations of an ongoing data center, thereby contributing to the profitability of operations of the center.

Embodiments also solve code compliance issues related to fire suppression and obstructions near the ceiling of a room. Use of the movable sash integral to the rack and tied to the fire alarm system enables an obstruction free area for the sprinkler systems and the fire suppression systems to work properly according to code.

While a number of exemplary aspects and embodiments have been discussed above, those of skill in the art will recognize certain modifications, permutations, additions and sub combinations thereof. It is therefore intended that the following appended claims and claims hereafter introduced are interpreted to include all such modifications, permutations, additions and sub-combinations as are within their true spirit and scope. The applicant or applicants have attempted to disclose all the embodiments of the invention that could be reasonably foreseen. There may be unforeseeable insubstantial modifications that remain as equivalents.

We claim:

1. A system for controlling the flow of air over the top of racks containing computer servers arrayed in rows in a room comprising:
    a computer rack door with openings which allow air flow through the door,
    channels attached to the sides of the door, arrayed parallel to the sides of the door, with the tops of the channels near the top of the door,
    a rectangular air impermeable sash capable of mounting on the door through interaction of the side edges of the sash with the channels,
    the sash vertically movable from a lower position wherein the top edge of the sash is approximately adjacent to the top edge of the door, and the upper position in which the top edge of the sash is capable of close proximity to the ceiling of the room,
    seals on the top edge and the side edges of the sash, when in the upper position the seal on the top edge capable of a sealing interaction with the ceiling and when in the upper position the seals on the side edges capable of a sealing interaction with seals on adjacent sashes also in the upper position,
    an elevation mechanism capable of elevating and lowering the sash between the lower and upper positions, the elevation mechanism capable of operation in response to signals from a control mechanism, and
    a control mechanism capable of signaling the elevation mechanism.

2. The system of claim 1 wherein the door is a front door.

3. The system of claim 1 wherein the door is a back door.

4. The system of claim 1 wherein the sash is manufactured of a strong, hard, transparent or translucent material.

5. The system of claim 1 wherein the material of manufacture of the sash is chosen from the group of materials consisting of poly(methyl methacrylate), polycarbonate, polystyrene, polyvinyl chloride, polyethylene terephthalate, polyethylene, polypropylene, soda lime glass, and borosilicate glass.

6. The system of claim 1 wherein the sash is manufactured of poly(methyl methacrylate).

7. The system of claim 1 wherein the material of manufacture of the sash is chosen from the group consisting of steel, aluminum, iron and copper.

8. The system of claim 1 wherein the channels are on the inside surface of the door.

9. The system of claim 1 wherein the channels are on the outside surface of the door.

10. The system of claim 1 wherein the material of manufacture of the seal is chosen from the group consisting of plastic and rubber.

11. The system of claim 1 wherein the seals are grommet brushes.

12. The system of claim 1 wherein the elevation mechanism comprises an elongated screw.

13. The system of claim 1 wherein the elevation mechanism comprises a notched rod.

14. The system of claim 1 wherein the control mechanism is activated by a button on the outside of the door.

15. The system of claim 1 wherein the control mechanism is a fire response system.

16. The system of claim 1 further comprising a battery.

17. A system for controlling the flow of air over the top of racks containing computer servers arrayed in rows in a room comprising:
- a computer rack door with openings which allow air flow through the front door,
- channels attached to and parallel to the sides of the door on the inside of the front door, with the tops of the channels near the top of the door,
- a rectangular air impermeable sash made of poly (methyl methacrylate) material mounted on the door through interaction of the side edges of the sash with the channels,
- the sash vertically movable from a lower position wherein the top edge of the sash is approximately adjacent to the top edge of the door, and the upper position in which the top edge of the sash is capable of touching the ceiling of the room,
- grommet brush seals on the top edge and the side edges of the sash, when in the upper position the grommet brush seal on the top edge is capable of a sealing interaction with the ceiling and when in the upper position the grommet brush seals on the side edges are capable of a sealing interaction with grommet brush seals on adjacent sashes which are also in the upper position,
- an elevation mechanism capable of elevating and lowering the sash between the lower and upper positions using a linear actuator, the elevation mechanism capable of operation in response to signals from a control mechanism, and
- a control mechanism which activates the elevation mechanism and is signaled through a button located on the outside of the door and through a fire response system.

18. A system for controlling the flow of air over the top of racks containing computer servers arrayed in rows in a room comprising:
- a computer rack door with openings which allow air flow through the door,
- channels attached to the sides of the door, arrayed parallel to the sides of the door, with the tops of the channels near the top of the door,
- a rectangular air impermeable sash capable of mounting on the door through interaction of the side edges of the sash with the channels,
- the sash vertically movable from a lower position wherein the top edge of the sash is approximately adjacent to the top edge of the door, and the upper position in which the top edge of the sash is capable of close proximity to the ceiling of the room,
- seals on the top edge and the side edges of the sash, when in the upper position the seal on the top edge capable of a sealing interaction with the ceiling and when in the upper position the seals on the side edges capable of a sealing interaction with seals on adjacent sashes also in the upper position,
- an elevation mechanism capable of elevating and lowering the sash between the lower and upper positions, the elevation mechanism comprising manual means for raising the sash from the lower to the upper position and a locking mechanism capable of securing the sash in the upper position, and
- a control mechanism capable of unlocking the locking mechanism, thereby allowing the descent of the sash from the upper position to the lower position.

19. The system of claim 18 wherein the elevation mechanism is a handle.

20. The system of claim 18 wherein the locking mechanism is an electromagnet.

21. The system of claim 18 wherein the control mechanism is activated by a button on the outside of the door.

22. The system of claim 18 wherein the control mechanism is a fire response system.

23. The system of claim 18 wherein the elevation mechanism comprises, on each side of the sash, a square conduit connected to the back of the U-shaped channel, the conduit communicating with the channel via a slot along the length of the conduit and the channel, a ferrous piston capable of movement within the conduit, an arm at the bottom of the piston, the arm extending through the slot and connected to the bottom edge of the sash, a multiplicity of electromagnets arrayed along the length of the conduit, the electromagnets capable of restricting the vertical movement of the piston when the electromagnets are energized, and a handle attached to the sash.

24. The system of claim 23 wherein the control mechanism unlocks the locking mechanism by de-activating the electromagnets.

* * * * *